United States Patent
Mitsui et al.

(10) Patent No.: US 6,276,913 B1
(45) Date of Patent: Aug. 21, 2001

(54) MOLD FOR RESIN SEALING

(75) Inventors: Masanori Mitsui; Masanori Mikawa, both of Fukuoka (JP)

(73) Assignee: Mitsui High-Tech Inc., Fukuoka (JP)

( * ) Notice: Subject to any disclaimer, the term of this patent is extended or adjusted under 35 U.S.C. 154(b) by 0 days.

(21) Appl. No.: 09/495,905

(22) Filed: Feb. 2, 2000

(30) Foreign Application Priority Data

Feb. 5, 1999 (JP) .................................................. 11-028836

(51) Int. Cl.[7] .......................... H01L 21/58; B29C 33/42; B29C 45/02
(52) U.S. Cl. .......................... 425/116; 249/95; 425/544; 264/272.15; 264/272.17
(58) Field of Search ........................ 264/272.15, 272.17; 425/116, 125, 544, 572, 588; 249/95

(56) References Cited

U.S. PATENT DOCUMENTS 4,862,586 * 9/1989 Osada ............................... 264/272.17
5,663,104 * 9/1997 Fukuyama ....................... 264/272.17

FOREIGN PATENT DOCUMENTS 1-301316-A * 12/1989 (JP) ...................................... 425/544
6-143360    5/1994 (JP) .

* cited by examiner

*Primary Examiner*—Robert Davis
(74) *Attorney, Agent, or Firm*—Greenblum & Bernstein, P.L.C.

(57) ABSTRACT

In the surface of a lower die 104 in a resin sealing mold, a region where an external leads 18 of a lead frame 12 and its peripheral regions having a width of 0.1 mm are mirror-finished to form a mirror-face region 22. The other region than the mirror-face region is subjected to discharging processing to form a satin-finished region 24. The resin-sealing mold having such a structure permits a package to be smoothly released and prevents resin from remaining.

11 Claims, 4 Drawing Sheets

M  Resin adhered region

MOLD FOR RESIN SEALING

BACKGROUND OF THE INVENTION

1. Field of the Invention

The present invention relates to a mold for resin sealing (hereinafter referred to as "resin sealing mold") and more particularly to a resin sealing mold which can smoothly release a package and prevent resin from remaining.

2. Description of the Related Art

A package for constituting the appearance of a semiconductor device has conventionally manufactured in the following manner.

First, a resin sealing mold having a cavity is arranged on a resin sealing region of a lead frame. Thereafter, the cavity is filled with resin, and the filled resin is hardened by heating to form a package.

The surface of the cavity of such a resin sealing mold is satin-finished so that the package can be smoothly released from the cavity. The satin-finished surface can be formed by discharging processing and sandblasting for the cavity surface. The cavity having a satin-finished surface is disclosed in e.g. JP-A-6-143360.

However, in recent years, a package having a structure in which an external leads is exposed from a bottom of the sealing resin, such as "SON" (Small Outline Non-leaded) or "QFN" (Quad Flat Non-leaded) has been developed for commercial use. In such as structure, a bottom surface of the leads is exposed from the bottom surface of the package so that the bottom surface of the leads can be contacted to a wiring layer of an outer circuit such as printed circuit board. Therefore these structure has an advantage that mounting area can be reduced. However, where the package having a SON structure or QFN structure is made by resin sealing using the mold with the cavity surface satin-finished, resin remains on the exposed external leads which may lead to connection failure in packaging.

FIG. 7 is a sectional view of a conventional mold structure which shows the manner of deposition of resin on an external lead. As seen from the figure, in the case of using the conventional mold, the external lead 18 is placed on a satin-finished region 24, and a minute space M is formed between the external lead 18 and a mold 100. When resin sealing is executed in such a state, the sealing resin injected into the cavity 14 invades the above minute space M, i.e. areas indicated by arrow in FIG. 2 so that the resin is deposited on the surface of the external lead 18. Thereafter, when the mold 100 is hardened by heating, the resin deposited on the external lead 18 is also hardened as it is so that it remains on the external lead 18 after the package is released from the mold. This remaining resin may leads to connection failure in packaging.

On the other hand, the satin-finished region formed on the surface of a cavity 14 is an important component for smoothly releasing a package so that such a region as wide as possible are preferably formed. Accordingly, it is necessary to prevent the resin from being deposited on the external lead while the satin-finished region is left.

Thus, in a semiconductor device such as the SON structure or QFN having a structure in which external leads are exposed from a bottom of the sealing resin, the portion of the leads embedded into the sealing resin is relatively short so that it is difficult to assure sufficient contact between the external leads and the resin. Therefore, great force applied to the external leads when the package is released may give rise to falling out of the lead. The resin deposited on the rear face of the external leads may lead to connection failure of the package.

SUMMARY OF THE INVENTION

An object of the present invention is to provide a reliable resin sealing mold which permits a package to be smoothly released without applying force to the lead and prevents resin from remaining on the lead.

In accordance with the first aspect of the present invention, a resin-sealing mold used for resin-sealing a semiconductor chip, having a cavity 14 for mounting a semiconductor chip 10 is loaded, is characterized in that said cavity comprises external lead placing regions 20 where external leads of said lead frame are placed; a mirror-face region 22 formed in at least said external lead placing regions; and a satin-finished region 24 formed in at least a portion of the other region than the mirror-face region 22.

Because of these configurations according to the first aspect, it is possible to provide a reliable resin sealing mold which permits a package to be smoothly released without applying force to the lead and prevents resin from remaining on the lead.

In a second aspect of the invention, the resin-sealing mold according to the first aspect is characterized in that said mirror-face region is composed of the external lead placing regions and areas surrounding the periphery thereof.

In a third aspect of the invention, the resin-sealing mold according to the first aspect is characterized in that said mirror-face region 22 surrounds the periphery of said external lead placing regions over a width of 0.1 mm or more.

In a fourth aspect of the invention, the resin-sealing mold according to the first aspect is characterized in that said mirror-face region 22 is formed over the entire periphery of a lower surface of the cavity.

Because of these configurations according to the fourth aspect, even when external leads are formed with a minute pitch, it is possible to prevent the external leads from being brought into contact with the satin-finished region owing to misalignment.

In a fifth aspect of the invention, the resin-sealing mold according to the first aspect is characterized in that said mirror-face region 22 is formed partially over the periphery of a lower surface of the cavity.

In this configuration, since at least a portion of the periphery of the lower surface of the cavity is satin-finished, the release of a package is improved while deposition of resin is prevented.

In a six aspect of the invention, the resin-sealing mold according to the first aspect is characterized in that said cavity has a rectangular or square lower surface, and said mirror-face region 22 is formed in the other region than corners of the rectangular or square lower surface.

In this configuration, since the satin-finished region is formed at the corners, the release of a package is further improved while deposition of the resin is prevented.

In a seventh aspect of the invention, the resin-sealing mold according to the first aspect is characterized in that said resin-sealing mold is used for forming a semiconductor device with external leads which are exposed at a bottom of sealed resin.

In a semiconductor device having a structure in which are external leads are exposed from a bottom of the sealing resin, the portion of the lead embedded into the sealing resin of the lead is relatively short so that it is difficult to assure sufficient contact between the lead and the resin. The resin deposited on the rear face of the external leads may lead to connection failure of the package. The invention provides a reliable semiconductor device which permits the package to be taken out from the mold with no great force being applied and is free from connection failure.

In an eighth aspect of the invention, the resin-sealing mold according to the first aspect is characterized in that said resin-sealing mold is used for a semiconductor device having an SON structure.

In a ninth aspect of the invention, the resin-sealing mold according to the first aspect is characterized in that said resin-sealing mold is used for a semiconductor device having a QFN structure.

In a tenth aspect of the invention, the resin-sealing mold according to the first aspect is characterized in said semiconductor chip is mounted on a die pad of a lead flame and a mirror-face region is formed in said external lead placing regions and a region for placing the die pad.

In an eleventh aspect of the invention, the resin-sealing mold according to the first aspect is characterized in said semiconductor chip is placed on a part of an inner surface of the cavity and a mirror-face region is formed in the part and said external lead placing regions.

The above and other objects and features of the present invention will be more apparent from the following description taken in conjunction with the accompanying drawings.

DESCRIPTION OF THE PREFERRED EMBODIMENT

A feature of the invention resides in that a mirror face is formed in a region of the cavity of a resin sealing mold where external leads are placed so that deposition of the resin on the external lead is prevented, and at least a portion of the wall of a package is satin-finished so that the package can be smoothly released.

The inventors of the invention have examined the conventional structure to find the cause of resin remaining on an external lead. In order to overcome such an inconvenience, the present invention has been accomplished.

The inventors have created various prototypes repeatedly and accomplished an efficient structure which can smoothly release a package and prevent resin from remaining. A detailed explanation will be given of a characteristic new structure of the invention.

Embodiment 1

Figure 1:
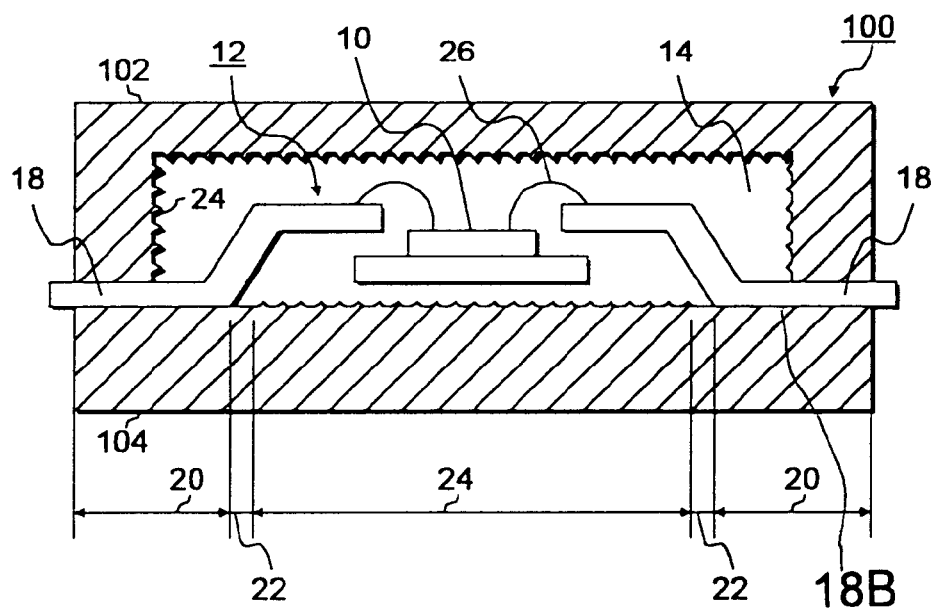
FIG. 1 is a sectional view of a resin sealing mold according to the present invention.

FIG. 1 is a sectional view of a resin sealing mold according to a first embodiment of the present invention.

Now referring to FIG. 1, an explanation of the resin sealing mold according to this embodiment.

A mold 100 is characterized in that its inner wall is formed so that a mirror-face region 22 includes a region corresponding to an external lead placing region 20 and another region surrounding its periphery, and the other region than the mirror-face region is satin-finished.

The surface of the other region than the mirror-face region 22 is satin-finished. In this way, since the external lead placing regions 20 and their peripheral regions are mirror-finished, even when the positions of placing the external leads 18 is slightly misaligned, the external leads are placed on the mirror-face region 22, thereby maintaining the preferred contact of the external lead 18 and the inner wall of the mold. This prevents resin from invading between the external leads 18 and the inner wall of the mold.

Figure 2:
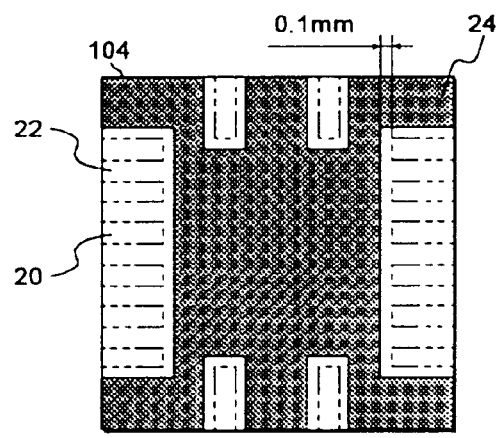
FIG. 2 is a plan view showing the surface shape of a lower die 104 suitable to form a SON type package.

The mold 100 is used for resin-sealing a semiconductor chip 10 loaded on a lead frame 12. Within the mold 100, a cavity 14 is formed for accommodating the semiconductor chip loading portion of the lead frame 10. The semiconductor chip 12 is connected to the lead frame 12 using wires 26 as shown in FIG. 2. In resin-sealing, the cavity 14 is filled with sealing resin. As shown, the mold 100 is preferably composed of a pair of dies, i.e. an upper die 102 and a lower die 104. In this case, the lead frame 12 is sandwiched between the upper die 102 and the lower die 104.

The external lead placing regions 20 are areas where external leads of a lead frame 12 are placed. The surface of each of these areas is made flat in order to increase its contact with the external leads. Preferably, the surface is mirror-finished to increase the flatness, thereby further improving the contact with the external leads 18. The structure thus formed can prevent resin from invading the bottom of each of the external leads 18.

The mirror-face region 22 is formed to surround the periphery of each of the external lead placing regions and its face is mirror-finished. In this way, since the periphery of each of the external lead placing regions 20 is mirror-finished, even when the external leads are slightly misaligned, the external leads are placed on the mirror-face region 22, thereby maintaining the contact between the mold and with the external leads. In view of this, it is desired that the mirror-face region 22 is defined taking the positioning error of the mold into consideration. Normally, each of the external leads 20 is preferably covered with the mirror-face region over a width of 0.1 mm or more. More preferably, the mirror-face region and the external lead placing regions 20 are integrally mirror-finished.

The satin-finished region 24 is formed in at least a portion of the other region than the external lead placing regions 20 and mirror-face region 22, thereby contributing to releasing of a package. From the viewpoint of improvement of releasing force for the package, the satin-finished region is formed in an area which is as wide as possible. More preferably, the satin-finished region is formed in the other entire area than the external lead placing regions 20 and mirror-face region 22. The satin-finished face can be easily formed by discharging processing or sandblasting for the surface of the cavity 14.

Embodiment 2

FIG. 2 is a plan view of the surface shape of a lower die 104 of a mold device which is suitable to form an SON-type package. As seen from the figure, where the SON-type package is to be formed, the external lead placing regions 20 corresponding to the shapes of the external leads of the package are defined on the surface on the outer periphery of the lower die 104. The mirror-face region 22 having a width of 1 mm or more is defined on the periphery of each of the external lead placing regions 20. In this embodiment, some part of the mirror-face region 22 for plurality of the outer leads are unified. The satin-finished region 24 is formed on the entire outside of the mirror-face region 22, thereby increasing the releasing force for the package. In this configuration, since the satin-finished region is formed at the corners of the lower die 104, the release of a package is further improved while deposition of the resin is prevented.

Embodiment 3

Figure 3:
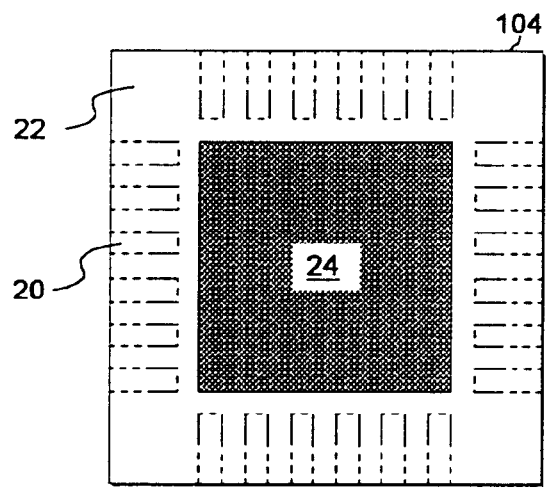
FIG. 3 is a plan view showing the surface shape of a lower die 104 suitable to form a QFN type package.

FIG. 3 is a plan view of the surface shape of a lower die 104 of a mold device which is suitable to form a QFN-type package. As seen from the figure, where the SON-type package is to be formed, the external lead placing regions 20 corresponding to the shapes of the external leads of the package are defined on the surface on the outer periphery of the lower die 104.

A doughnut-shaped mirror-face region 22 is formed in an area covering all the external lead placing regions 20. The satin-finished region 24 is formed inside the mirror-face 22, i.e. on the surface of a central portion of the lower die 104. In this embodiment, all of the mirror-face region 22 for plurality of the outer leads are unified. Namely entire surface of the cavity bottom of the lower die 104 except for the central portion, are mirror-polished.

In a semiconductor device having a structure in which are external leads are exposed from a bottom of the sealing resin, the portion of the lead embedded into the sealing resin of the lead is relatively short so that it is difficult to assure sufficient contact between the lead and the resin. The resin deposited on the rear face of the external leads may lead to connection failure of the package. The invention provides a reliable semiconductor device which permits the package to be taken out from the mold with no great force being applied and is free from connection failure. Further this structure is easy to be formed.

In accordance with the invention, since the external leads 18 of the lead frame are placed in a flat region of the mold, and the satin-finished region 24 is formed on the surface of the cavity 14, the releasing force can be increased and invasion of resin on the bottom of the external cavity 18 can be prevented. Accordingly, a semiconductor device can be provided in which resin residue after the package has been formed is reduced and the poor connection to the external leads is not likely to occur.

An explanation will be given of a method of forming a package of a semiconductor device using the mold according to the invention.

Figure 4:
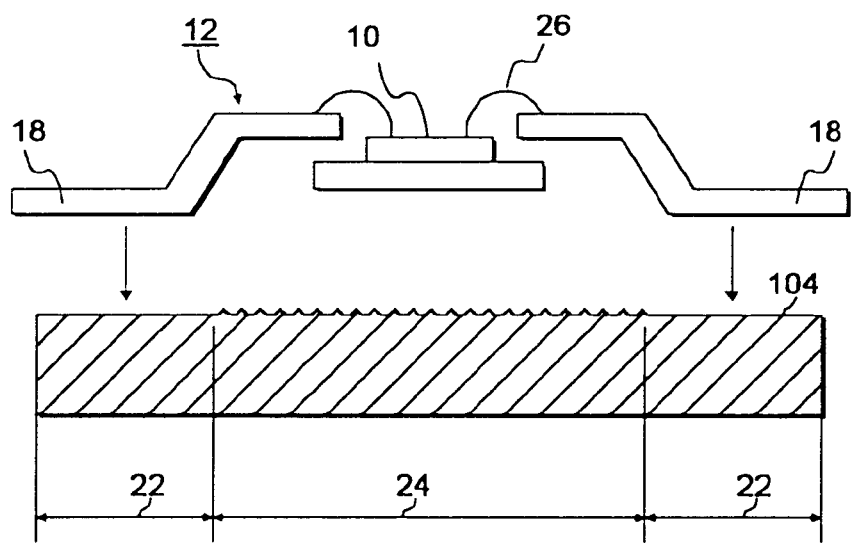
FIG. 4 is a sectional view showing the first step of the process for forming a package according to the present invention.

FIG. 4 is a sectional view showing the first step forming a package according to the invention (as shown in FIGS. 1–3 show embodiments 1–3). As seen from the figure, where the package for a semiconductor device is to be formed, the region where the external leads 18 of a lead frame 12 are placed and their peripheral regions having a width of 0.1 mm are mirror-finished to form a mirror-face region 22. The other area than the mirror-face region 22 is subjected to discharging processing to form a satin-finished region 24. In this way, the lower die is prepared. The lead frame 104 where the semiconductor chip is loaded is positioned above the lower die 104, and the external leads 18 of the lead frame 12 are placed on the mirror-finished region 22 formed on the surface of the lower die 104. At this time, attention should be paid so that the external leads 18 are not placed on the satin-finished region.

Figure 5:
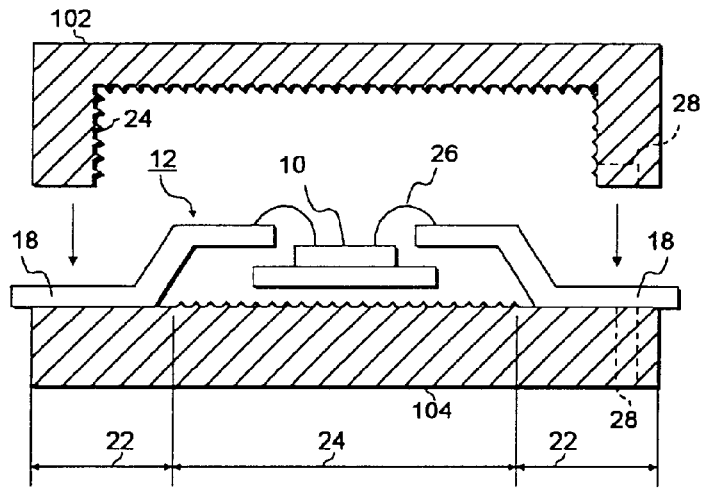
FIG. 5 is a sectional view showing the second step of the process for forming a package according to the present invention.

FIG. 5 is a sectional view showing the second step forming a package according to the invention. As seen from the figure, an upper die 102 is positioned above the lead frame 12 placed on the lower die 104. Thereafter, the peripheral wall of the upper die 102 is placed on the upper face of each of external leads 18.

Figure 6:
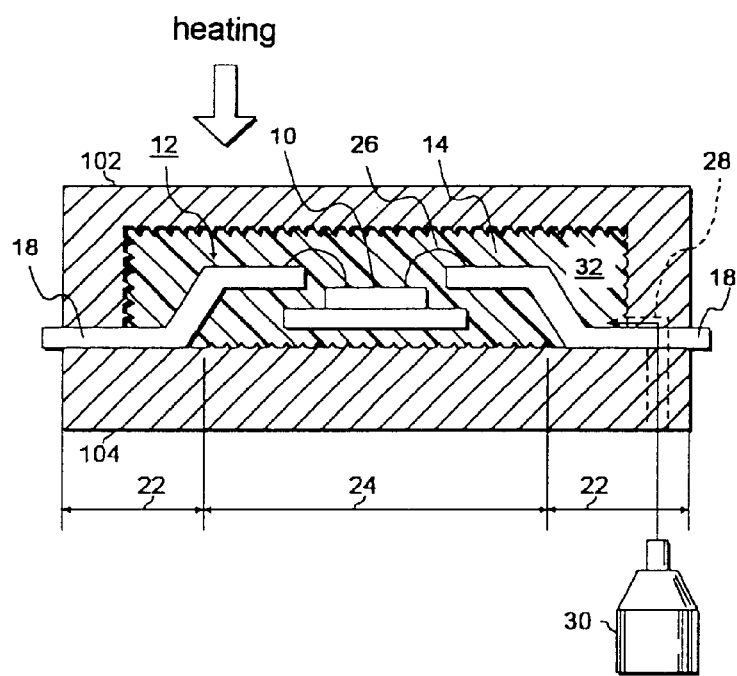
FIG. 6 is a sectional view showing the third step of the process for forming a package according to the present invention.
Figure 7:
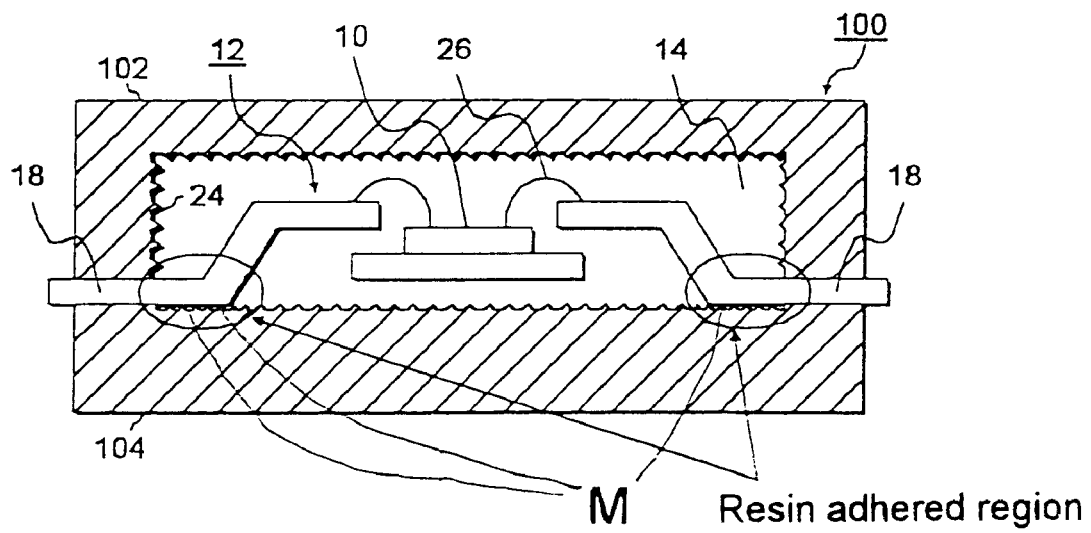
FIG. 7 is a sectional view showing the relationship between a conventional mold structure and resin deposition on an external lead.

FIG. 6 is a sectional view showing the third step forming a package according to the invention. As seen from the figure, a pot 30 for injecting resin is arranged beneath a resin injecting inlet 28 of the lower die 104. The cavity 14 formed between the upper die 102 and lower die 104 is filled with resin. Thereafter, the upper die 102 is heated to harden the resin filled in the cavity 14. After the resin has been hardened, the upper die 102 and lower die 104 are detached from the lead frame 12.

Thus, the package for a semiconductor device is formed on the lead frame 12. Thereafter, the redundant portion of each external lead protruding from the package is cut away so that the semiconductor device in which the external leads are exposed from the bottom of the package can be accomplished.

Further, this structure is applicable not only to the structure having external leads are exposed from the bottom of the package to a structure having anyone of a die pad or semiconductor chip is exposed from the bottom of the package. And this is also applicable to a structure having anyone of a die pad and semiconductor chip exposed from the bottom of the package and outer leads extended out of a side surface of the package.

As understood from the description hitherto made, in accordance with the present invention, a resin-sealing mold which permits a package to be smoothly released and is effective to prevent resin from being remaining.

In accordance with the invention, since the external leads 18 of the lead frame are placed in a flat region of the mold, and the satin-finished region is formed on the surface of the cavity 14, the releasing force can be increased and invasion of resin on the bottom of the external cavity 18 can be prevented. Accordingly, a semiconductor device can be provided in which resin residue after the package has been formed is reduced and the poor connection to the external leads is not likely to occur.

What is claimed is:

1. A resin-sealing mold used for resin-sealing a semiconductor chip, having a cavity for mounting a semiconductor chip, said cavity comprising:
   external lead placing regions where external leads of said lead frame are placed, wherein the external lead placing regions comprise:
      a mirror-face region formed in at least said external lead placing regions; and
      a satin-finished region formed in at least a portion of the other region than the mirror-face region.

2. A resin-sealing mold according to claim 1, wherein said mirror-face region is composed of the external lead placing regions and areas surrounding the periphery thereof.

3. A resin-sealing mold according to claim 1, wherein said mirror-face region is formed so as to surround the periphery of said external lead placing regions over a width of 0.1 mm or more.

4. A resin-sealing mold according to claim 1, wherein said mirror-face region is formed over the entire periphery of a lower surface of the cavity.

5. A resin-sealing mold according to claim 1, wherein said mirror-face region is formed so as to partially cover the periphery of a lower surface of the cavity except for a part of the peripheral portion.

6. A resin-sealing mold according to claim 1, wherein said cavity has a rectangular or square lower surface, and said mirror-face region is formed in the other region than corners of the rectangular or square lower surface.

7. A resin-sealing mold according to claim 1, wherein said resin-sealing mold is used for forming a semiconductor device with external leads which are exposed at a bottom of sealed resin.

8. A resin-sealing mold according to claim 1, wherein said resin-sealing mold is used for a semiconductor device having an SON structure.

9. A resin-sealing mold according to claim 1, wherein said resin-sealing mold is used for a semiconductor device having a QFN structure.

10. A resin-sealing mold according to claim 1, wherein said semiconductor chip is mounted on a die pad of a lead flame and a mirror-face region is formed in said external lead placing regions and a region for placing the die pad.

11. A resin-sealing mold according to claim 1, wherein said semiconductor chip is placed on a part of an inner surface of the cavity and a mirror-face region is formed in the part and said external lead placing regions.

* * * * *

UNITED STATES PATENT AND TRADEMARK OFFICE
CERTIFICATE OF CORRECTION

PATENT NO. : 6,276,913 B1
DATED : August 21, 2001
INVENTOR(S) : Masanori Mitsui et al.

Page 1 of 1

It is certified that error appears in the above-identified patent and that said Letters Patent is hereby corrected as shown below:

<u>Title page,</u>
Item [73], "Mitsui High-Tech Inc.", should read -- Mitsui High-Tec Inc.--

Signed and Sealed this

Fourteenth Day of May, 2002

*Attest:*

*Attesting Officer*

JAMES E. ROGAN
*Director of the United States Patent and Trademark Office*